(12) United States Patent
Li et al.

(10) Patent No.: US 9,148,168 B2
(45) Date of Patent: Sep. 29, 2015

(54) SYSTEM AND METHOD OF IMPROVING STABILITY OF CONTINUOUS-TIME DELTA-SIGMA MODULATORS

(71) Applicant: ANALOG DEVICES TECHNOLOGY, Hamilton (BM)

(72) Inventors: Zhao Li, Toronto (CA); David Alldred, Toronto (CA)

(73) Assignee: Analog Devices Global, Hamilton (BM)

( * ) Notice: Subject to any disclaimer, the term of this patent is extended or adjusted under 35 U.S.C. 154(b) by 49 days.

(21) Appl. No.: 14/065,732

(22) Filed: Oct. 29, 2013

(65) Prior Publication Data

US 2015/0116138 A1   Apr. 30, 2015

(51) Int. Cl.
*H03M 1/10* (2006.01)
*H03M 3/00* (2006.01)
*H03M 1/12* (2006.01)
*H03M 1/00* (2006.01)

(52) U.S. Cl.
CPC ................ *H03M 3/368* (2013.01); *H03M 3/38* (2013.01); *H03M 1/00* (2013.01); *H03M 1/12* (2013.01); *H03M 3/30* (2013.01); *H03M 3/424* (2013.01); *H03M 3/454* (2013.01)

(58) Field of Classification Search
CPC ............ H03M 3/30; H03M 1/00; H03M 1/12
USPC .................................. 341/143, 118, 120, 155
See application file for complete search history.

(56) References Cited

U.S. PATENT DOCUMENTS

| | | | |
|---|---|---|---|
| 6,505,221 B1 | 1/2003 | Maschmann | |
| 7,315,269 B2 * | 1/2008 | Schreier et al. | 341/143 |
| 7,405,687 B2 | 7/2008 | Mitteregger et al. | |
| 7,876,250 B2 | 1/2011 | Breems et al. | |
| 8,089,382 B2 | 1/2012 | Pagnanelli | |
| 8,199,039 B2 | 6/2012 | Mattisson | |
| 2005/0137816 A1 * | 6/2005 | Chuang et al. | 702/106 |
| 2007/0035426 A1 | 2/2007 | Schreier et al. | |
| 2007/0171109 A1 | 7/2007 | Mitteregger | |
| 2012/0056765 A1 | 3/2012 | Hode | |
| 2013/0187803 A1 | 7/2013 | Kaald | |

FOREIGN PATENT DOCUMENTS

| | | |
|---|---|---|
| DE | 10-2005-020067 | 12/2006 |
| EP | 2869470 | 5/2015 |

OTHER PUBLICATIONS

European Search Report issued in EP Patent Application Serial No. 14188357.9 mailed Mar. 25, 2015, 7 pages.

* cited by examiner

*Primary Examiner* — Joseph Lauture
(74) *Attorney, Agent, or Firm* — Patent Capital Group

(57) ABSTRACT

An analog-to-digital converter (ADC) can include a continuous-time delta sigma modulator and calibration logic. The calibration logic can calibrate direct feedback and flash clock delay coefficients of the continuous-time delta-sigma modulator without interrupting the normal operations of the ADC (e.g., in situ). Thus, the calibration logic can rectify performance and stability degradation by calibrating suboptimal coefficients.

17 Claims, 5 Drawing Sheets

SYSTEM AND METHOD OF IMPROVING STABILITY OF CONTINUOUS-TIME DELTA-SIGMA MODULATORS

TECHNICAL FIELD

This disclosure relates in general to the field of analog-to-digital converters (ADCs) and, more particularly, to providing stability codes thereto.

BACKGROUND

A delta-sigma (ΔΣ) modulator is one type of analog-to-digital converter. Within ΔΣ modulators generally, there is a specific type called a continuous-time ΔΣ modulator (CT-DSM). Stability in these CT-DSMs is an important concern. To control the stability of a CT-DSM, direct feedback coefficients and flash digital-to-analog (DAC) timing coefficients are commonly used.

Direct feedback—or sometimes called excess loop delay compensation—is used to ensure loop stability when the modulator's center frequency is not at $f_s/4$ (i.e., a quarter of the sampling frequency). As the fastest feedback term in a modulator, the direct feedback coefficient affects the noise transfer function (NTF) outside of the pass-band. A suboptimal direct feedback coefficient increases out-of-band spectral power and hence decreases the stability of the modulator. Due to process variation and manufacturing tolerances, the optimum direct feedback coefficient for maximum stability can differ between chips.

Similar to the direct feedback coefficient, the flash DAC timing coefficient—sometimes called flash clock delay—affects the out-of-band response of a CT-DSM. A suboptimal flash clock delay coefficient leads to peaks in a modulator's out-of-band spectrum, which degrades the stability of the system.

CT-DSMs, unlike their discrete-time ΔΣ modulator cousins, are timing sensitive and can become unstable if the direct feedback (excess loop delay compensation) and flash DAC timing coefficients are not set correctly. Due to process variation, which changes the optimal modulator parameters, performance is often sacrificed in the form of less aggressive noise shaping to ensure the modulator is stable with a large input.

A more stable modulator allows for a larger maximum-stable input. This larger maximum-stable input permits an increased maximum signal-to-noise ratio (SNR) for such a modulator over a less stable modulator. Alternatively, for a same maximum-stable input power as a less stable modulator, a more stable modulator can employ a more aggressive noise shaping, due to the increased stability, leading to an increased SNR.

Both the direct feedback coefficient and the flash DAC timing coefficient can be tuned in a laboratory environment. However, it is difficult to tune these coefficients in the field because the spectrum of the associated modulator is not known.

A previous effort to solve this problem designed blocks, such as direct feedback and flash clock delay circuits, that desensitize modulator stability to process variation. Because of inherent differences between simulation and actual silicon, the direct feedback and flash DAC timing coefficients for these circuits need to be lab-tuned to find their optimum values. Thus, if those coefficients are not affected by process variation, the lab-tuned values can be used for production releases. However, if the coefficients are sensitive to process variation, a less aggressive noise-shaping should be used to ensure the modulator is stable for the designed maximum-stable input power level.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

An analog-to-digital converter (ADC) can include a continuous-time delta-sigma modulator and calibration logic. The calibration logic can calibrate direct feedback and flash clock delay coefficients of the continuous-time delta-sigma modulator without interrupting the normal operations of the ADC (e.g., in situ). Thus, the calibration logic can calibrate suboptimal coefficients to rectify performance and stability degradation.

In one example, a calibration system is provided and includes a continuous-time delta sigma analog-to-digital converter (ADC) that receives an analog input and converts the analog input to digital data; a data monitor that parses the digital data to produce an output; and calibration logic that adjusts stability parameters of the ADC, at least based on the output of the data monitor.

In another example, a method is provided. The method is implemented by a calibration system and includes converting, with a continuous-time delta sigma analog-to-digital converter (ADC), an analog input to digital data; parsing, with a data monitor, the digital data to produce an output; and adjusting, with calibration logic, stability parameters of the ADC, at least based on the output of the data monitor.

In yet another example, logic is encoded in one or more non-transitory media that includes code for execution and, when executed by a processor, is operable to perform operations including receiving an output from a data monitor; and adjusting stability parameters of a continuous-time delta sigma analog-to-digital converter (ADC), at least based on the output of the data monitor, wherein the ADC converts an analog input to digital data.

Example Embodiments

In one embodiment, calibration logic tunes stability coefficients of an ADC in-situ during a power-up sequence of the ADC. This tuning allows for a more aggressive noise-shaping than might otherwise be implemented. Furthermore, design complexity can be reduced since robustness to a process variation becomes of less concern.

Figure 1:
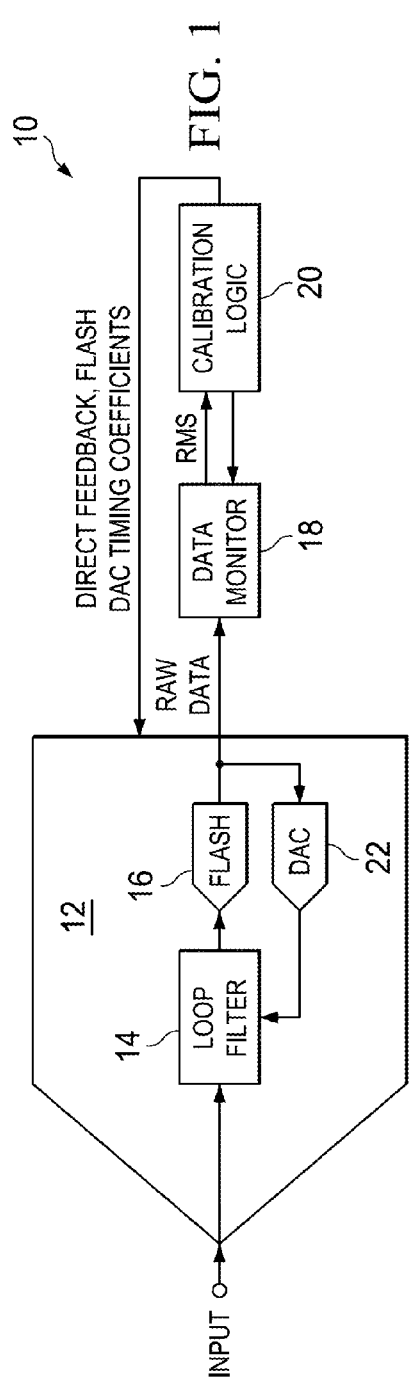
FIG. 1 illustrates a block diagram of an in situ stability calibration technique in accordance with one embodiment.

FIG. 1 shows a block diagram of an in situ stability calibration technique. The system 10 includes a continuous-time ΔΣ modulator (CT-DSM) 12 with programmable stability coefficient control, a data monitor 18, and calibration logic 20. The CT-DSM 12 includes a loop filter 14, a flash ADC 16, and a digital-to-analog converter (DAC) 22.

Figure 2:
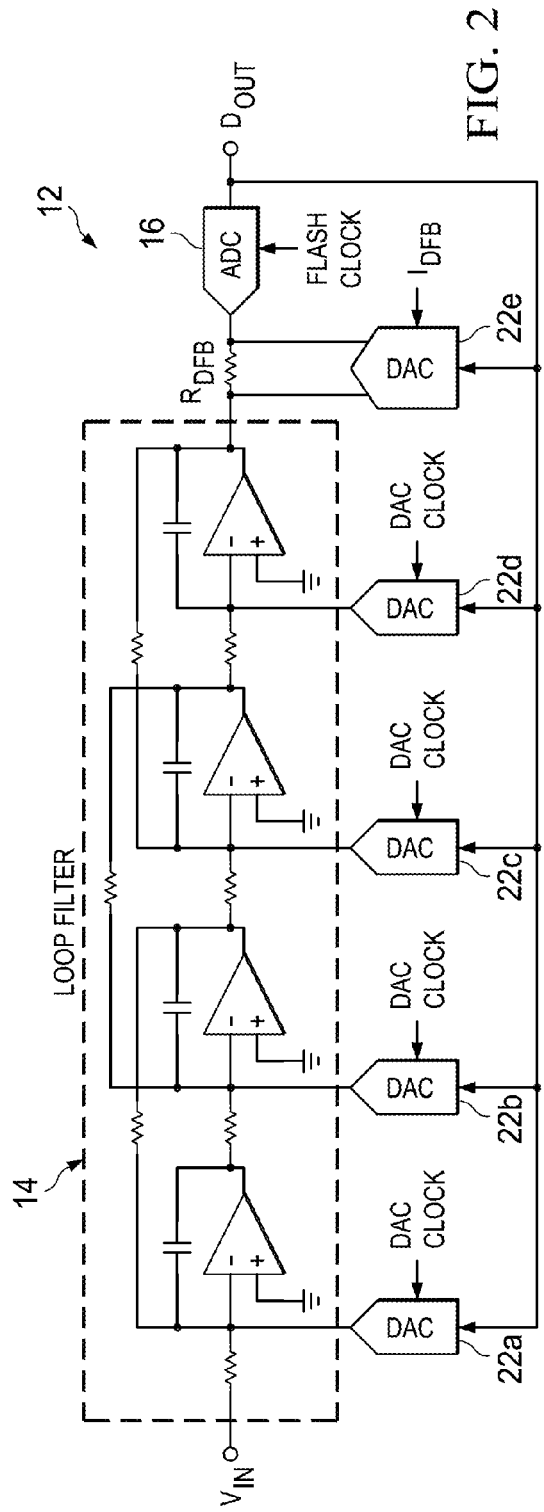
FIG. 2 illustrates a block diagram of a CT-DSM in accordance with one embodiment.

FIG. 2 illustrates a more detailed block diagram of the CT-DSM 12. As shown in FIG. 2, the loop filter 14 actively filters an input signal input to the CT-DSM 12 and outputs a low-pass filtered signal through resistor $R_{DFB}$ to flash ADC 16. The flash ADC 16 includes comparators that compare the output received from the loop filter 14 with reference values. The flash ADC 16 outputs digital data that indicates the reference values that caused their respective comparators to transit. This digital data is output to DAC 22 and data monitor 18, as shown in FIG. 1. The DAC 22 includes individual DACs that are illustrated in FIG. 2 as 22a, 22b, 22c, and 22d. Each of the individual DACs 22a-22d converts a portion of the digital data into an analog signal and outputs the analog signal to a different stage of loop filter 14.

The data monitor 18 parses the digital data output by the CT-DSM 12. In one embodiment, the data monitor 18 is a power meter that measures a power of a signal output by the CT-DSM 12. In a specific embodiment, the data monitor 18 is implemented as a digital RMS meter.

Further, in one embodiment, the data monitor 18 measures a sum-of-squares of values of the output of CT-DSM 12. Alternatively, the data monitor 18 estimates a power by calculating a sum-of-absolute values of the output of CT-DSM 12. In addition, the data monitor 18 can sub-sample the output of the CT-DSM to reduce design complexity.

The calibration logic 20 adjusts stability parameters of the CT-DSM 12 based on an output of the data monitor 18. In particular, the calibration logic 20 finds control coefficients of the CT-DSM 12, such as a direct feedback coefficient and a flash DAC timing coefficient, that cause the stability of the CT-DSM 12 to increase. In an embodiment in which the data monitor 18 outputs a power value, these control coefficients cause the output of the data monitor 18 to decrease. In an embodiment in which the data monitor 18 outputs an effective number of bits (ENOB) or a signal-to-noise ratio, the control coefficients cause the output of the data monitor 18 to increase.

In one specific implementation, the calibration logic 20 adjusts the direct feedback coefficient by at least one of changing a bias current connected to resistor $R_{DFB}$, component values (e.g., a resistance of resistor $R_{DFB}$, a capacitance, or an inductance), and a reference voltage. In addition, the calibration logic 20 can also adjust the flash DAC timing coefficient by at least one of changing a bias current, a component value, and a reference voltage.

Parseval's theorem states that the output of the data monitor 18 is proportional to the integral of the squared magnitude of the NTF in the frequency domain. Since the NTF is much larger out-of-band than in-band, the RMS output of the ADC 16, in the absence of an input signal, is dominated by the out-of-band noise power that is intended to be minimized.

As discussed above, the CT-DSM 12 includes adjustable stability parameters including direct feedback and flash DAC timing coefficients. The direct feedback coefficient pertains to the value of the voltage developed across resistor $R_{DFB}$. The flash DAC timing coefficient pertains to a delay between a clock used by individual DACs 22a-22d and a flash clock used by flash ADC 16.

Figure 3:
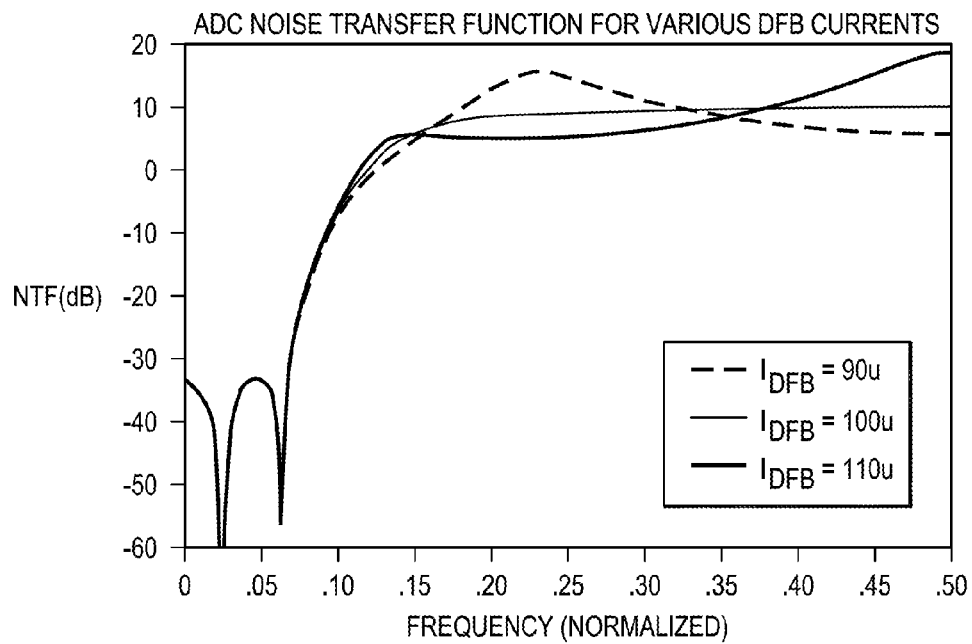
FIG. 3 illustrates an effect of a direct feedback coefficient on a noise shaping characteristic.
Figure 4:
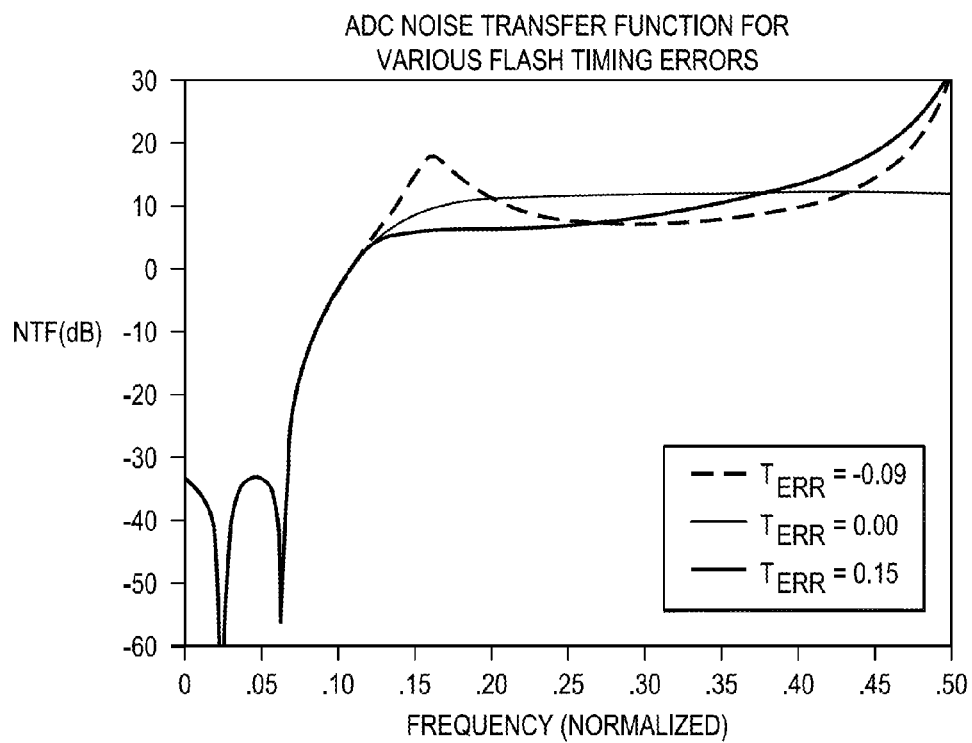
FIG. 4 illustrates an effect of a flash DAC timing coefficient on a noise shaping characteristic.

The direct feedback and flash DAC timing coefficients control the shape of the noise transfer function (NTF) outside of the modulator's passband, as shown in FIGS. 3-4. In particular, FIG. 3 illustrates the effect of a direct feedback coefficient on a noise shaping characteristic. FIG. 4 illustrates the effect of a flash DAC timing coefficient on a noise shaping characteristic.

In those Figures, a flat out-of-band response is more desirable as it minimizes the out-of-band (and total) noise power and provides the maximum stable input range. Thus, as shown in FIG. 3, the optimum direct feedback current ($I_{DFB}$=100 μA) has the most stable NTF. And, as shown in FIG. 4, a timing error $T_{ERR}$=0 has the most stable NTF.

Figure 5:
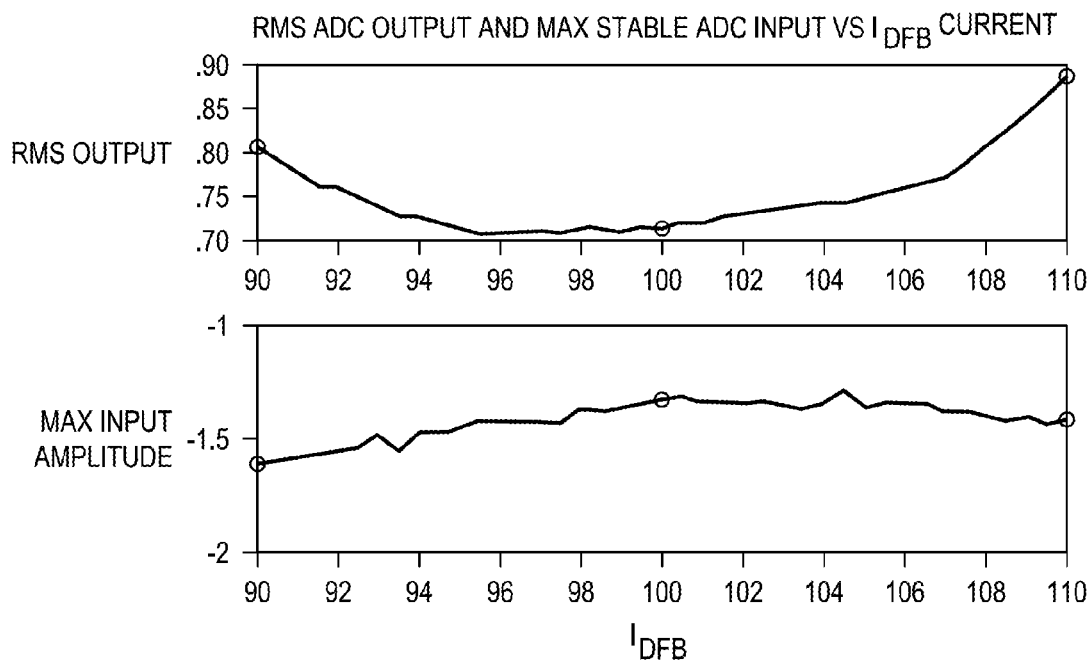
FIG. 5 illustrates an RMS output of an ADC and a maximum stable input versus a direct feedback current.
Figure 6:
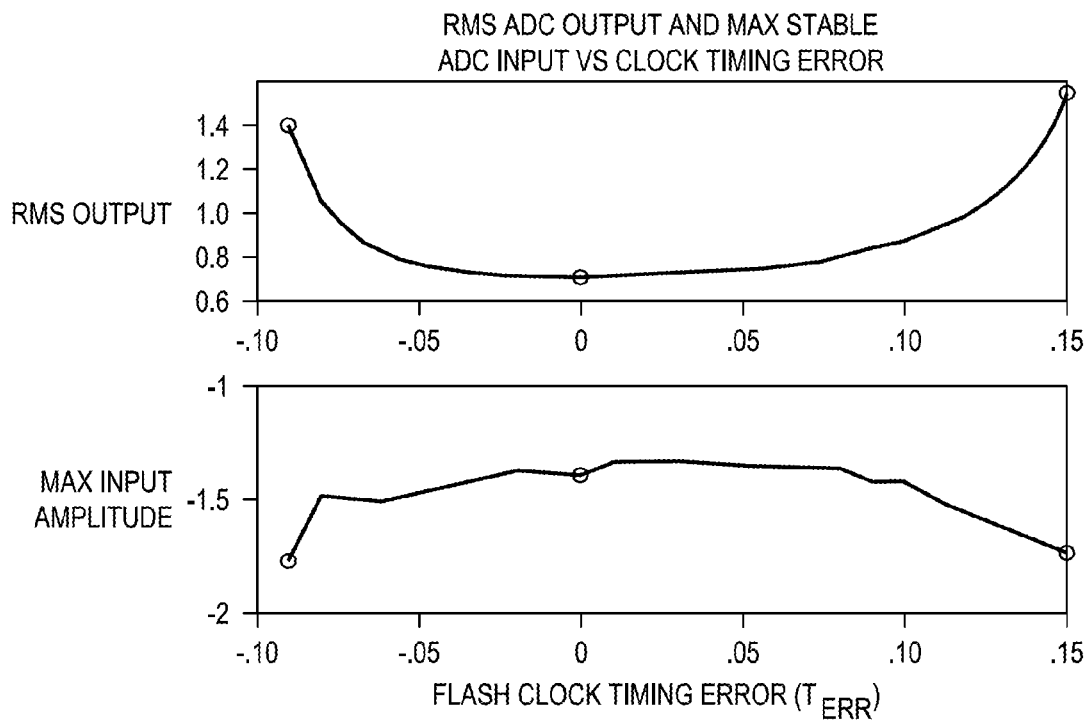
FIG. 6 illustrates an RMS output of the ADC and a maximum stable input versus a flash DAC clock timing error.

FIGS. 5-6 show simulations comparing RMS outputs of the ADC 16 and maximum stable input levels with different direct feedback and flash DAC delay coefficients, respectively. In particular, FIG. 5 illustrates an RMS output of the ADC 16 and a maximum stable input versus a direct feedback current. The circled points refer to the waveforms in FIG. 3. FIG. 6 illustrates an RMS output of the ADC 16 and a maximum stable input versus a flash DAC clock timing error. The circled points in that Figure refer to the waveforms in FIG. 4. As is evident, minimizing the RMS output of the ADC 16 yields a modulator having a maximum stable input very close to a maximum.

The RMS output of the ADC 16 was measured against the direct feedback coefficient and the flash DAC timing coefficient (called "flash clock delay" in one implementation) controls for a plurality of ADCs. The average optimum direct feedback coefficient was found to be slightly lower than the design value. Thus, by adjusting the direct feedback coefficient, the maximum stable input of the modulator was improved over the default design setting. Correspondingly, for the same maximum stable input as the default, the in-band noise can be improved by using a more aggressive NTF. Similar results are expected with the flash DAC timing optimization.

Although the maximum stable input gains were modest in one of the ADCs, including such calibration allows for more aggressive noise-shaping and less finicky design. Design complexity can be reduced by allowing robustness to process variation to be traded for performance.

Figure 7:
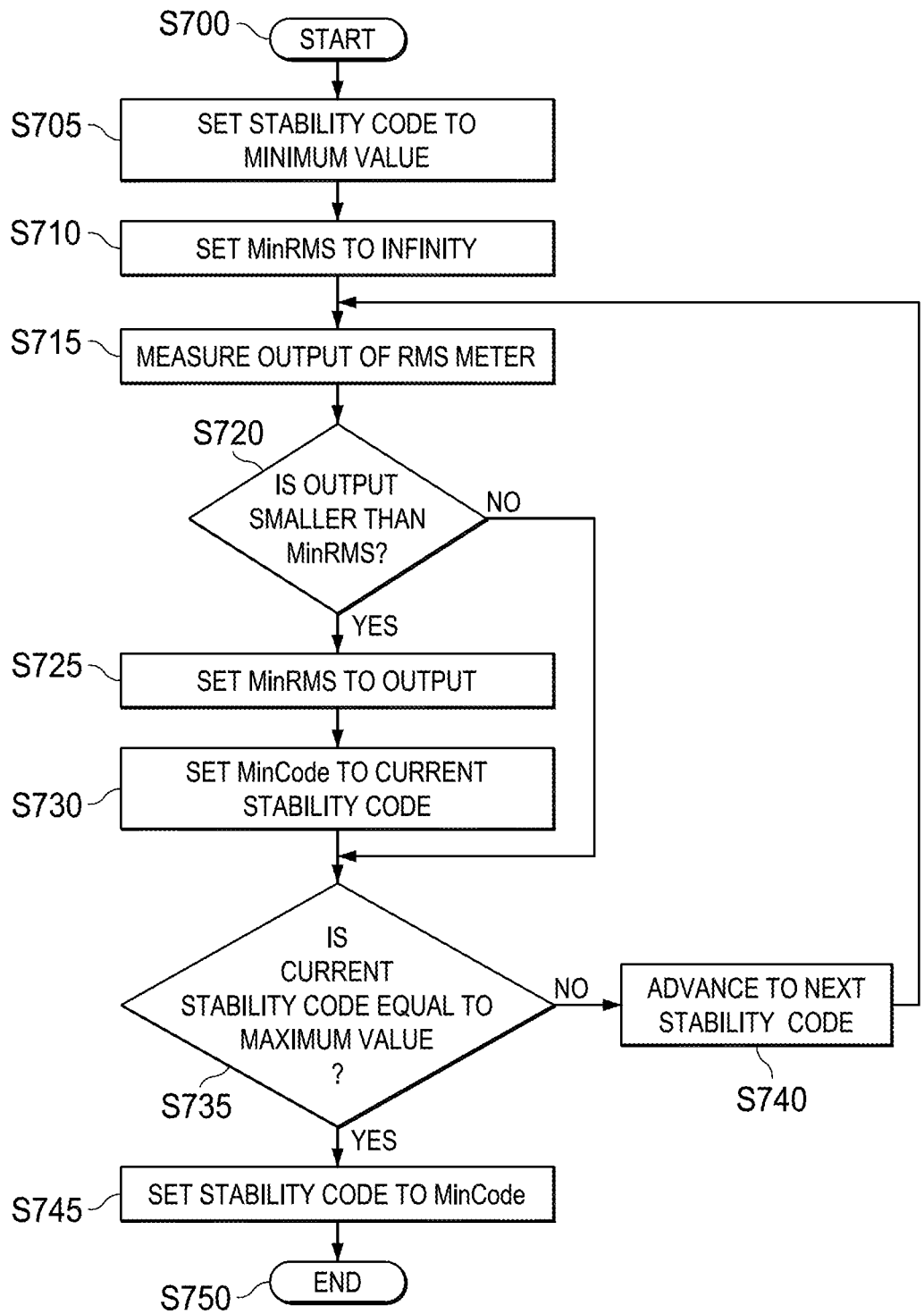
FIG. 7 is a simplified flow diagram illustrating potential operations associated with one embodiment of the present disclosure.
Figure 8:
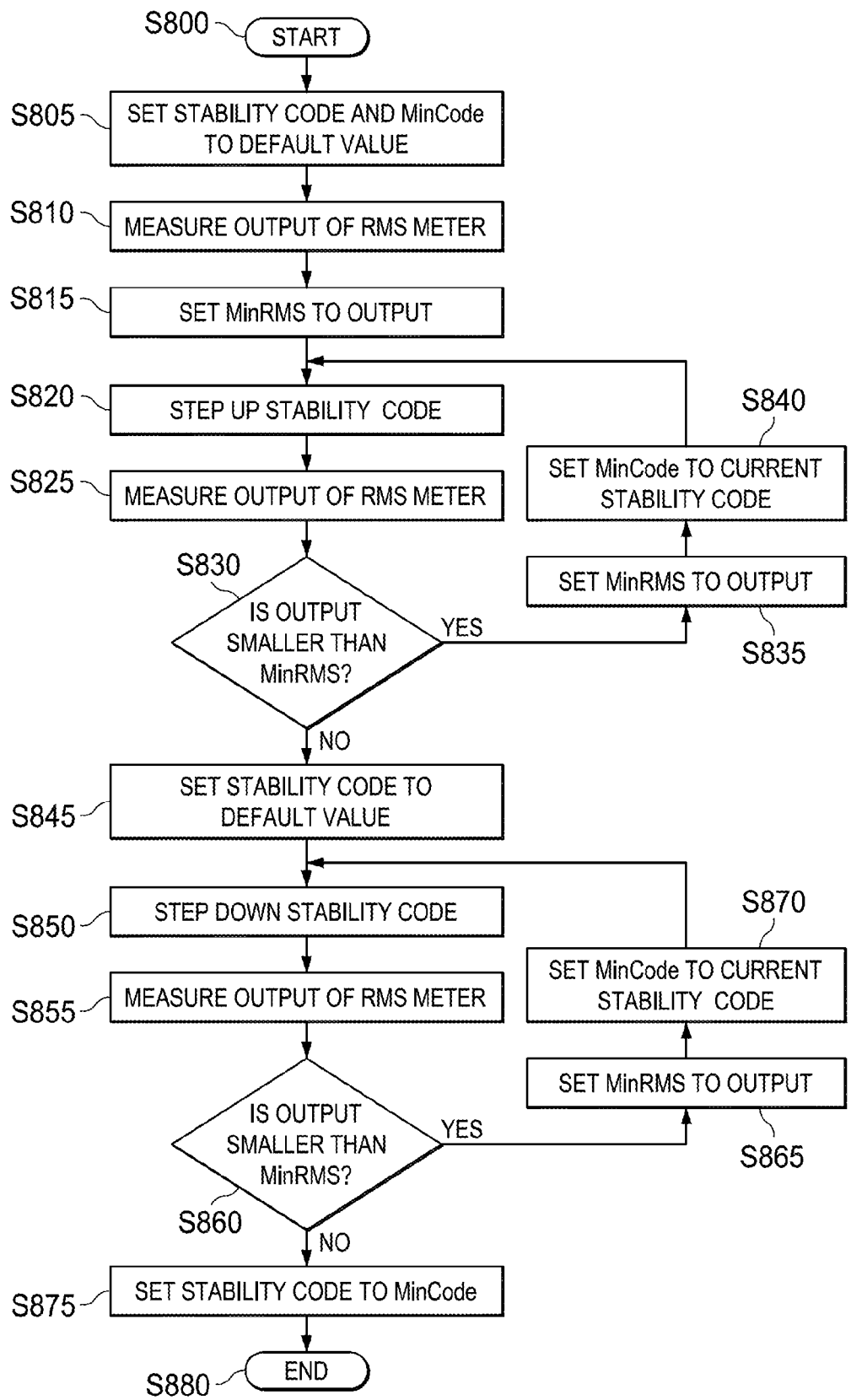
FIG. 8 is a simplified flow diagram illustrating potential operations associated with one embodiment of the present disclosure.

The operations of exemplary embodiments are set forth in FIGS. 7 and 8. In both examples, the input of the loop filter 14 is initially disconnected so the input to the flash ADC 16 is a small fraction of the full-scale signal as it consists of only thermal and quantization noise. With a sufficiently high number of samples by the data monitor 18, the variance in the RMS measurement due to thermal and quantization noise can be made arbitrarily small.

FIG. 7 is a simplified flow diagram illustrating potential operations associated with one embodiment of the present disclosure. The operations begin at S700 and proceed to S705. At S705, the calibration logic 20 sets a stability code of the ADC 12 to a minimum value. As discussed above, the stability coefficient controls can include a direct feedback coefficient and a flash DAC timing coefficient. The algorithm then advances to S710, at which the calibration logic 20 sets a minimum RMS value initially to an arbitrarily large number, such as infinity. In one implementation, this value is a finite maximum possible value. This minimum RMS value later corresponds to the minimum output of the data monitor 18.

At S715, the calibration logic 20 measures an output of the data monitor 18. Then, at S720, the calibration logic 20 determines whether the output of the data monitor 18 is less than the minimum RMS value. Because the calibration logic 20 initially sets the minimum RMS value to an arbitrarily large number, the initial determination at S720 is intended to indicate that the output of the data monitor 18 is less than that arbitrarily large number. When the calibration logic 20 determines the output of the data monitor 18 is less than the minimum RMS value, the algorithm advances to S725. When the output of the data monitor 18 is not less than the minimum RMS value, the algorithm advances to S735.

At S725, the calibration logic 20 sets the minimum RMS value to the output of the data monitor 18. In one embodiment, the calibration logic 20 updates the current minimum RMS value with the output of the data monitor 18. In other embodiments, the calibration logic 20 retains the previous minimum RMS value for information recording purposes. Such purposes can include generating a histogram or generating an error report. At S730, the calibration logic 20 sets a minimum code variable to a current stability code. For example, the calibration logic 20 stores the minimum code variable in a memory. The calibration logic can retain a previous minimum code variable for use in, e.g., more advanced algorithms or generating an error report or histogram.

At S735, the calibration logic 20 determines whether the current stability code is equal to a maximum value. That is, the calibration logic 20 determines whether the algorithm has tested all of the stability codes, i.e., from the minimum code set at S705 to the maximum code described by S735. When the calibration logic 20 determines the current stability code is not equal to the maximum value, the algorithm advances to S740. When the calibration logic 20 determines the current stability code is equal to the maximum value, the algorithm advances to S745.

At S740, the calibration logic 20 advances to the next stability code. The algorithm then proceeds to S715.

At S745, the calibration logic 20 sets the stability code to a stability code set in S730. Generally speaking, the calibration logic 20 sets this stability code to the minimum stability code set in the most recent iteration of S730. The process then proceeds to end at S750.

Thus, in such an embodiment, the calibration logic 20 implements a simple linear search between two ranges where the stability code that results in the minimum ADC RMS power is chosen as the optimum solution.

FIG. 8 is a simplified flow diagram illustrating potential operations associated with a hill climbing algorithm implemented by one embodiment of the present disclosure. The operations begin at S800 and proceed to S805. At S805, the calibration logic 20 sets a stability code and a minimum code to default values. These default values for the stability code and minimum code are characteristics of a chip in which the system 10 is included. For example, each chip in a single product line can share the default values of the stability code and the minimum code. At S810, the calibration logic 20 measures the output of the data monitor 18. Then, at S815, the calibration logic 20 sets the minimum RMS value to the output of the data monitor 18.

Subsequently, at S820, the calibration logic 20 steps up the stability code. For example, the calibration logic 20 increments the stability code. The calibration logic 20 then measures an output of the data monitor 18 at S825. At S830, the calibration logic 20 determines whether the output of the data monitor measured at S825 is less than the minimum RMS value set at S815. When the calibration logic 20 determines the output of the data monitor 18 is less than the minimum RMS value, the operations advance to S835. When the calibration logic 20 determines the output of the data monitor 18 is not less than the minimum RMS value, the operations advance to S845.

Thus, in one embodiment, the calibration logic 20 first attempts to advance the stability code in one direction (e.g., by incrementing the stability code). The calibration logic 20 determines in S830 whether advancing the stability code in that direction reduces the minimum RMS value or not. If it does not reduce the minimum RMS value, the calibration logic 20 advances the stability code in the other direction (e.g., by decrementing the stability code).

At S835, the calibration logic 20 sets the minimum RMS value to the output of the data monitor 18 measured in S825. At S840, the calibration logic 20 sets the minimum code to the current stability code. The operations then return to S820.

At S845, the calibration logic 20 sets the stability code to a default value. For example, the calibration logic 20 sets the stability code to the same default to which the stability code was set in S805. Then, at S850, the calibration logic 20 steps down the stability code. For example, the calibration logic 20 decrements the stability code. At S855, the calibration logic 20 measures an output of the data monitor 18. Subsequently, at S860, the calibration logic 20 determines whether the output of the data monitor 18 measured at S855 is less than the minimum RMS value. When the calibration logic 20 determines in S860 the output of the data monitor 18 is less than the minimum RMS value, the operations advance to S865. When the calibration logic 20 determines in S860 the output of the data monitor 18 is not less than the minimum RMS value, the operations advance to S875.

At S865, the calibration logic 20 sets the minimum RMS value to the output of the data monitor 18 measured in S855. At S870, the calibration logic 20 sets the minimum code to the current stability code. The operations then return to S850.

At S875, the calibration logic 20 sets the stability code to a minimum code set in S840 or S870. The operations then end at 5880.

The aforementioned hill climbing algorithm can reduce calibration time. The use of this algorithm presumes the relationship between the stability code and the minimum RMS value is a parabolic function. This algorithm can be applied to a higher degree function, such as cubic or quartic, particularly if modifications are made.

Thus, the subject matter of FIG. 8 sets forth an example of an advanced algorithm, namely a hill climbing algorithm. Other advanced algorithms include a random walk algorithm, a simulated annealing algorithm, a genetic algorithm, and a tabu search algorithm. Such an algorithm can reduce calibration time.

In one example of a random walk algorithm, the calibration logic 20 randomly increments or decrements the stability code periodically over time. The calibration logic 20 then measures an output of the data monitor 18. When the calibration logic 20 determines the output of the data monitor 18 is less than a previous minimum RMS value, the calibration logic 20 sets the minimum RMS value to the output of the data monitor 18. The calibration logic 20 then sets the minimum code to the random stability code that caused this lesser RMS value.

With a simulated annealing algorithm, the calibration logic 20 adopts a probabilistic approach to finding a global minimum of the RMS value corresponding to the stability code. In one example, the calibration logic 20 considers states neighboring the default stability code and probabilistically chooses to either stay with the current code or transition to a neighboring code. The term "neighboring" in this context does not require the offset be an offset immediately adjacent to a previous one. In some iterations of the simulated annealing algorithm, suboptimal solutions are considered acceptable to avoid local optimization traps.

In an example of a genetic algorithm, the calibration logic 20 determines RMS values corresponding to multiple initial stability codes (e.g., a minimum code, a default code, and a maximum code). In a given iteration of the algorithm, the calibration logic 20 selects a plurality of more optimal control codes as candidates for the next iteration, along with modified versions of those control codes. The calibration logic 20 continues until a sufficiently optimal stability code is determined or until a given number of iterations has been completed.

In an example of a tabu search, the calibration logic 20 begins with an initial stability code (e.g., a minimum code, a default code, and a maximum code). The calibration logic 20 then checks the neighbors of the initial stability code. For example, the calibration logic 20 increments or decrements the initial stability code. The calibration logic 20 then measures an output of the data monitor 18. When the calibration logic 20 determines the output of the data monitor 18 is less than a previous minimum RMS value, the calibration logic 20 sets the minimum RMS value to the output of the data monitor 18. The calibration logic 20 then sets the minimum code to the stability code that caused this lesser RMS value. Of course, although this search was described with reference to an adjacent neighbor, the neighbor of a stability code need not be an immediately adjacent stability code. Thus, in some embodiments, the neighbor can be a predetermined number of codes (e.g., 2) separated from the initial code in initial iterations of the algorithm and can be only a single code away in later iterations. Similarly, the calibration logic 20 can implement an adaptive approach in which the neighbor is determined by parsing the RMS value received from the data monitor 18.

Modifications

In the aforementioned ADC, the stability coefficient controls are direct feedback and flash DAC timing coefficients. However, the direct feedback and flash DAC timing coefficients are merely examples of stability coefficient controls and are not intended to limit the same. It is within the scope of the present disclosure that the stability coefficient controls can include other values, such as resistor values.

In one embodiment, the calibration logic 20 optimizes the stability parameters separately (i.e., calibration of the direct feedback coefficient first and then the flash DAC timing coefficient). Alternatively, the controls can be calibrated together, forming a two dimensional sweep, but such a sweep is unlikely to yield improvements since there is no correlation between the controls.

The techniques described in the present disclosure can be applied to an ADC, such as one manufactured by Analog Devices of Norwood, Mass. More generally, these teachings can be applied in any system in which feedback is present, such as general ADCs, amplifiers, sensors, communications, and power management.

In the operations described with regard to FIG. 7, the calibration logic 20 determines, at S720, whether an output of the data monitor 18 is less than, e.g., a previous output of the data monitor 18. Such a determination is specific to one implementation, although other implementations are possible, as long as the determination pertains to increasing the stability of the ADC 12. For example, the calibration logic 20 can alternatively or additionally determine whether an output of the data monitor 18 is greater than, e.g., a previous output of the data monitor 18 in implementations in which, e.g., the data monitor 18 outputs an effective number of bits (ENOB) or a signal-to-noise ratio (SNR). The determinations in S830 and S860 in FIG. 8 can be similarly modified.

Thus, the settings in S745 and S875 can be generalized as setting stability codes in response to determinations that a stability of the ADC 12 is greater than a previous stability of the ADC 12.

In the operations described in FIG. 7, the stability code can also be decremented from a maximum value, rather than incremented from a minimum value. Thus, in such an implementation, the determination in S735 pertains to the current stability code being equal to a minimum value.

Further, in the operations described in FIG. 8, the stability code was stepped up in S820 prior to being stepped down in S850. The order of operations S820-S840 are arbitrarily performed before operations S850-S870. That is, the operations of FIG. 8 can also be performed effectively by stepping down the stability code in S850 and performing operations S855-S870 before stepping up the stability code in S820 and performing operations S825-S840.

In one implementation, the calibration logic 20 is implemented on an embedded programmable microprocessor. The calibration logic 20 can also be implemented on-chip such as with custom logic, such as an application-specific integrated circuit (ASIC). Further, the calibration logic 20 can be implemented off-chip with a field-programmable gate array (FPGA), a programmable logic array (PAL), generic array logic (GAL), a digital signal processor (DSP), or PC-based solutions such as Matlab and Labview.

FIG. 2 shows an example in which the DAC 22 includes four individual DACs 22*a*-22*d*. Of course, the number of individual DACs is not limited to four, and DAC 22 can include more or fewer individual DACs.

The above chip description is presented by way of example only and is not intended to be limiting. For example, the chip can be modified to include a fast Fourier transform (FFT) circuit block (not pictured). The FFT circuit block can look at the output of the CT-DSM 12 in the frequency domain. In such an embodiment, the calibration logic 20 has knowledge of the output spectrum. Thus, the calibration logic 20 can adjust the stability parameters of the CT-DSM 12 until out-of-band peaking is reduced (e.g., minimized). This approach is very hardware intensive due to the complexity of implementing an on-chip FFT circuit. Thus, this approach is best adopted in cases in which the calibration logic 20 is supplemented with additional processing and/or memory resources. For example, in one such implementation, the calibration logic 20 is supplemented with a digital signal processor (DSP).

In addition, the calibration logic 20 can be modified to directly ascertain the stability of the modulator 12 (e.g., determining its maximum stable input) by increasing the power of an input test signal until the modulator 12 becomes unstable. The calibration logic 20 then optimizes the stability parameters so that the maximum stable input is maximized. In such an implementation, an on-chip test input signal is generated for the modulator 12. Further to such an implementation, calibration might be extremely long since it takes many clock cycles (sometimes, billions) for the modulator 12 to become unstable.

The present disclosure, while discussed in conjunction with one architecture, is explicitly not so limited. Its teachings are readily applicable to a myriad of converters, frameworks, circuitry, etc. Additionally, in the discussions of the embodiments above, the ADCs, the DACs, meters, filters, power sources, amplifiers, gates, resistors, and capacitors can readily be replaced, substituted, or otherwise modified to accommodate particular circuitry needs. The use of complementary electronic devices, hardware, software, etc. offers an equally viable option for implementing the teachings of the present disclosure.

In one example embodiment, any number of electrical circuits of the FIGURES may be implemented on a motherboard of an associated electronic device. The motherboard can be a general circuit board that can hold various components of the internal electronic system of the electronic device and, further, provide connectors for other peripherals. More specifically, the motherboard can provide the electrical connections by which the other components of the system can communicate electrically. Any suitable processors (inclusive of digital signal processors, microprocessors, supporting chipsets, etc.), memory elements, etc., can be suitably coupled to the motherboard based on particular configuration needs, processing demands, computer designs, etc. Other components such as external storage, sensors, controllers for audio/video display, and peripheral devices can be attached to the motherboard as plug-in cards, via cables, or integrated into the motherboard itself.

In exemplary implementations, the calibration logic is implemented by logic encoded in one or more tangible media (e.g., embedded logic provided in an ASIC, a PAL, or a GAL). The logic can alternatively be encoded in one or more intangible media (e.g., DSP instructions, software [potentially inclusive of object code and source code] to be executed by a processor or any other similar machine, a transitory signal, a propagating wave, etc.).

A memory element can store software, logic, code, or processor instructions that are executed to carry out the calibration activities described in this disclosure. An example of such a memory element is a compact disc ROM (CD-ROM), a digital versatile disc ROM (DVD-ROM), a Blu-ray Disc (BD), or a flash memory. The memory elements can also store installation software that installs both the software that actually performs the operations, as well as associated drivers.

In another instance, operations of this disclosure are performed by a processor executing software downloaded from a server. In such an instance, the server stores and transmits the software in the same form executed by the processor. In another instance, the server stores and transmits an executable file that installs the software and associated drivers. Further, such software or executable file can be spread across multiple servers.

In another example embodiment, the electrical circuits of the FIGURES can be implemented as stand-alone modules (e.g., a device with associated components and circuitry configured to perform a specific application or function) or implemented as plug-in modules into application specific hardware of electronic devices. Particular embodiments of the present disclosure can be included in a system on chip (SOC) package, either in part or in whole. An SOC represents an IC that integrates components of a computer or other electronic system into a single chip. It can contain digital, analog, mixed-signal, and often radio frequency functions, all of which can be provided on a single chip substrate. Other embodiments can include a multi-chip-module (MCM), with a plurality of separate ICs located within a single electronic package and configured to interact with each other through the electronic package. In various other embodiments, the amplification functionalities can be implemented in one or more silicon cores in ASICs, FPGAs, and other semiconductor chips.

All of the specifications, dimensions, and relationships outlined herein (e.g., the number of processors and memory elements, logic operations, etc.) have only been offered for purposes of example and teaching only. Such information can be varied considerably without departing from the spirit of the present disclosure or the scope of the appended claims. The specifications apply only to non-limiting examples and, accordingly, they should be construed as such. In the foregoing description, example embodiments have been described with reference to particular processor and/or component arrangements. Various modifications and changes can be made to such embodiments without departing from the scope of the appended claims. The description and drawings are, accordingly, to be regarded in an illustrative rather than in a restrictive sense.

With the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES can be combined in various possible configurations, all of which are clearly within the broad scope of this disclosure. In certain cases, it may be easier to describe one or more of the functionalities of a given set of flows by only referencing a limited number of electrical elements. It should be appreciated that the electrical circuits of the FIGURES and their teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In this disclosure, references to various features (e.g., elements, structures, modules, components, operations, characteristics, etc.) included in "one embodiment," "example embodiment," "an embodiment," "another embodiment," "some embodiments," "various embodiments," "other embodiments," "an alternative embodiment," "an implementation," and the like are intended to mean that any such features are included in one or more embodiments of the present disclosure, but may or may not necessarily be combined in the same embodiments.

Numerous other changes, substitutions, variations, alterations, and modifications can be ascertained to one skilled in the art, and it is intended the present disclosure encompass all such changes, substitutions, variations, alterations, and modifications as falling within the scope of the appended claims. To assist the United States Patent and Trademark Office (USPTO) and, additionally, any readers of any patent issued on this application in interpreting the claims appended hereto, Applicants wish to note the Applicants: (a) do not intend any of the appended claims to invoke 35 U.S.C. section 112(f) as it exists on the date of the filing hereof unless the words "means for" or "step for" are specifically used in the particular claims; and (b) do not intend, by any statement in the specification, to limit this disclosure in any way that is not otherwise reflected in the appended claims.

The invention claimed is:
1. A calibration system, comprising:
a continuous-time delta sigma analog-to-digital converter (ADC) that receives an analog input and converts the analog input to digital data;
a data monitor that parses the digital data to produce an output; and
calibration logic configured to adjust stability parameters of the ADC, at least based on the output of the data monitor, wherein the stability parameters include at least one of a direct feedback coefficient of the ADC and a flash digital-to-analog converter (DAC) timing coefficient of the ADC.

2. The calibration system of claim 1, wherein the calibration logic adjusts the stability parameters by changing at least one of a bias current, a component value, and a reference voltage.

3. The calibration system of claim 1, wherein the data monitor is implemented as a a digital power meter, and the data monitor calculates a sum of squares of values of the digital data, calculates a sum of absolute values of values of the digital data, or sub-samples values of the digital data.

4. The calibration system of claim 1, wherein the calibration logic is implemented on an embedded programmable microprocessor, is implemented on-chip with the ADC by an application-specific integrated circuit (ASIC), or is implemented off-chip with a system including software.

5. The calibration system of claim 1, wherein the calibration logic either implements a linear search between two ranges or implements a hill climbing algorithm to choose a stability code for the ADC that results in the ADC producing a minimum root mean square (RMS) power.

6. The calibration system of claim 1, wherein the calibration logic implements an algorithm to choose a stability code for the ADC that results in the ADC producing a minimum root mean square (RMS) power, the algorithm being one of a simulated annealing algorithm, a genetic algorithm, or a random search.

7. A method implemented by a calibration system, the method comprising:
  converting, with a continuous-time delta sigma analog-to-digital converter (ADC), an analog input to digital data;
  parsing, with a data monitor, the digital data to produce an output; and
  adjusting, with calibration logic, stability parameters of the ADC, at least based on the output of the data monitor, wherein the stability parameters include at least one of a direct feedback coefficient of the ADC and a flash digital-to-analog converter (DAC) timing coefficient of the ADC.

8. The method of claim 7, wherein the adjusting adjusts the stability parameters by changing at least one of a bias current, a component value, and a reference voltage.

9. The method of claim 7, wherein the data monitor is implemented as a digital power meter, and the parsing calculates a sum of squares of values of the digital data, calculates a sum of absolute values of values of the digital data, or sub-samples values of the digital data.

10. The method of claim 7, wherein the calibration logic is implemented on an embedded programmable microprocessor, is implemented on-chip with the ADC by an application-specific integrated circuit (ASIC), or is implemented off-chip with a system including software.

11. The method of claim 7, further comprising:
  implementing a linear search between two ranges or implementing a hill climbing algorithm to choose a stability code for the ADC that results in the ADC producing a minimum root mean square (RMS) power.

12. The method of claim 7, further comprising:
  implementing an algorithm to choose a stability code for the ADC that results in the ADC producing a minimum root mean square (RMS) power, the algorithm being one of a simulated annealing algorithm, a genetic algorithm, or a random search.

13. Logic encoded in one or more non-transitory media that includes code for execution and, when executed by a processor, operable to perform operations comprising:
  receiving an output from a data monitor; and
  adjusting stability parameters of a continuous-time delta sigma analog-to-digital converter (ADC), at least based on the output of the data monitor, wherein the ADC converts an analog input to digital data, and the stability parameters include at least one of a direct feedback coefficient of the ADC and a flash digital-to-analog converter (DAC) timing coefficient of the ADC.

14. The logic of claim 13, wherein the adjusting adjusts the stability parameters by changing at least one of a bias current, a component value, and a reference voltage.

15. The logic of claim 13, wherein the processor is an embedded programmable microprocessor, is an application-specific integrated circuit (ASIC) on-chip with the ADC, or is a processor off-chip from the ADC in a system including software.

16. The logic of claim 13, the operations further comprising:
  implementing an algorithm to choose a stability code for the ADC to increase a stability of the ADC, the algorithm being one of a linear search between two ranges, a hill climbing algorithm, a simulated annealing algorithm, a genetic algorithm, or a random search.

17. The logic of claim 13, the operations further comprising:
  setting a stability parameter of the ADC in response to a determination that a stability of the ADC is greater than a previous stability of the ADC.

* * * * *